(12) United States Patent
Zhang et al.

(10) Patent No.: US 9,304,301 B2
(45) Date of Patent: Apr. 5, 2016

(54) CAMERA HARDWARE DESIGN FOR DYNAMIC REARVIEW MIRROR

(71) Applicant: GM GLOBAL TECHNOLOGY OPERATIONS LLC, Detroit, MI (US)

(72) Inventors: Wende Zhang, Troy, MI (US); Jinsong Wang, Troy, MI (US); Kent S. Lybecker, Rochester, MI (US); Jeffrey S. Piasecki, Rochester, MI (US); Ryan M. Frakes, Bloomfield Hills, MI (US); Travis S. Hester, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 157 days.

(21) Appl. No.: 14/040,969

(22) Filed: Sep. 30, 2013

(65) Prior Publication Data

US 2014/0176781 A1    Jun. 26, 2014

Related U.S. Application Data

(60) Provisional application No. 61/746,055, filed on Dec. 26, 2012.

(51) Int. Cl.

| | |
|---|---|
| *G02B 13/14* | (2006.01) |
| *H01L 27/146* | (2006.01) |
| *B60R 1/00* | (2006.01) |
| *H04N 9/00* | (2006.01) |
| *G02B 13/18* | (2006.01) |
| *H04N 7/18* | (2006.01) |
| *H04N 5/33* | (2006.01) |
| *H04N 5/355* | (2011.01) |

(52) U.S. Cl.
CPC . *G02B 13/14* (2013.01); *B60R 1/00* (2013.01); *G02B 13/18* (2013.01); *H01L 27/14618* (2013.01); *H01L 27/14625* (2013.01); *H04N 5/332* (2013.01); *H04N 5/35563* (2013.01); *H04N 7/18* (2013.01); *H04N 9/00* (2013.01); *H01L 2924/0002* (2013.01)

(58) Field of Classification Search
CPC ...... G02B 13/14; G02B 13/18; H04N 5/2254; H04N 9/00; H04N 5/332; H01L 27/14625; H01L 27/14618; B60R 1/00
USPC ........... 348/335, 340, 342, 297; 359/754, 778
See application file for complete search history.

(56) References Cited

U.S. PATENT DOCUMENTS

| | | | | |
|---|---|---|---|---|
| 5,353,080 | A  * | 10/1994 | Christman | 396/355 |
| 2006/0061882 | A1* | 3/2006 | Sun | 359/784 |
| 2007/0280669 | A1* | 12/2007 | Karim | 396/155 |
| 2008/0258045 | A1* | 10/2008 | Oike | H04N 5/3559 250/208.1 |
| 2012/0147187 | A1* | 6/2012 | Li et al. | 348/148 |

OTHER PUBLICATIONS

U.S. Appl. No. 13/835,741, Mar. 15, 2013.
U.S. Appl. No. 13/962,156, Aug. 8, 2013.

* cited by examiner

*Primary Examiner* — Nhan T Tran

(57) ABSTRACT

An apparatus for capturing an image includes a plurality of lens elements coaxially encompassed within a lens housing. One of the lens elements includes an aspheric lens element having a surface profile configured to enhance a desired region of a captured image. At least one glare-reducing element coaxial with the plurality of lens elements receives light subsequent to the light sequentially passing through each of the lens elements. An imaging chip receives the light subsequent to the light passing through the at least one glare-reducing element. The imaging chip includes a plurality of green, blue and red pixels.

19 Claims, 4 Drawing Sheets

CAMERA HARDWARE DESIGN FOR DYNAMIC REARVIEW MIRROR

CROSS REFERENCE TO RELATED APPLICATIONS

This application claims the benefit of U.S. Provisional Application No. 61/746,055, filed on Dec. 26, 2012, which is incorporated herein by reference.

TECHNICAL FIELD

This disclosure is related to improving the performance of in-vehicle vision systems.

BACKGROUND

The statements in this section merely provide background information related to the present disclosure. Accordingly, such statements are not intended to constitute an admission of prior art.

Vehicle systems often use in-vehicle vision systems for capturing images representing field of views rearward, forward and/or to the sides of a subject vehicle. In-vehicle vision systems often employ fisheye lenses that produce a wide panoramic field of view or hemispherical image. While such wide field of view lenses desirably capture a large scene, spherical or other optical aberrations are present within the captured image. For example, a diminished center region having a reduced size is present within the captured image. It is known, for example, to utilize software to enlarge the center region of the captured image through stretching; however, resolution related to detail per pixel is reduced after the captured image is stretched to enlarge the center region.

It is known when scattered light meets a horizontal surface, such as a roadway or water, a large portion of light is reflected with horizontal polarization. This horizontally polarized light often produces glare that reduces visibility by the human eye. Application of a polarizing material to a lens can attenuate received horizontally-polarized light reaching the human eye to improve contrast and perception of a scene.

SUMMARY

Apparatus for capturing an image includes a plurality of lens elements coaxially encompassed within a lens housing. One of the lens elements includes an aspheric lens element having a surface profile configured to enhance a desired region of a captured image. At least one glare-reducing element coaxial with the plurality of lens elements receives light subsequent to the light sequentially passing through each of the lens elements. An imaging chip receives the light subsequent to the light passing through the at least one glare-reducing element.

BRIEF DESCRIPTION OF THE DRAWINGS

One or more embodiments will now be described, by way of example, with reference to the accompanying drawings, in which:

FIG. 4-1 illustrates the at least one glare-reducing element of FIG. 1 including a polarized element and a photochromic element, in accordance with the present disclosure;

FIG. 4-2 illustrates a non-limiting embodiment of a top view of the photochromic element of FIG. 4-1 having portions of the photochromic element in the darkened state with different magnitudes of dimming, in accordance with the present disclosure;

DETAILED DESCRIPTION

Figure 1:
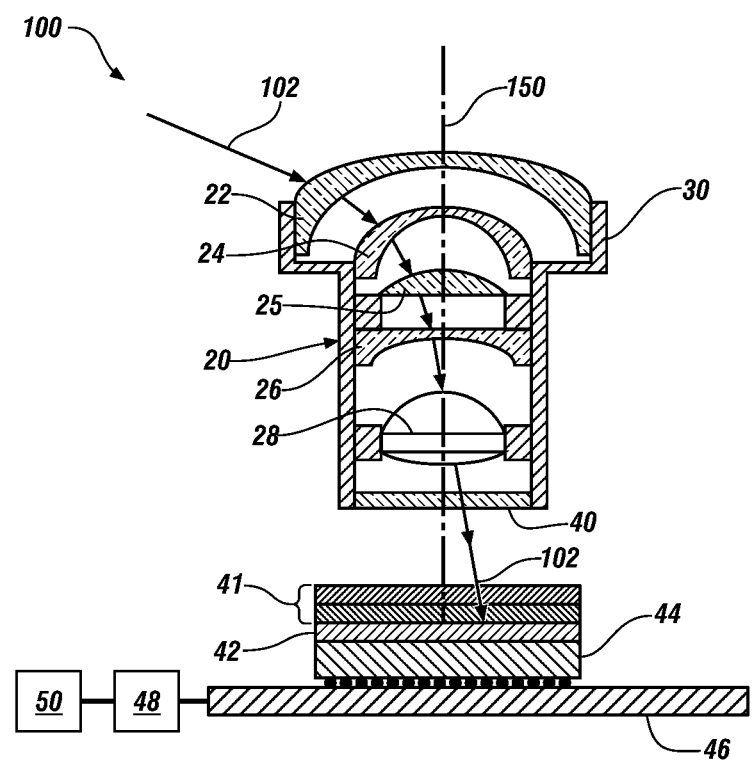
FIG. 1 illustrates an exemplary camera device including a lens with an aspheric lens element, at least one glare-reducing element and an imaging chip coaxially disposed along a longitudinal axis, in accordance with the present disclosure.

Referring now to the drawings, wherein the showings are for the purpose of illustrating certain exemplary embodiments only and not for the purpose of limiting the same, FIG. 1 schematically illustrates a camera device 100 including a lens 20, an infrared (IR) cut-off filter 40, at least one glare-reducing element 41, a cover glass 42, an imaging chip 44 and a camera board 46. A lens housing 30 encompasses the lens 20 that includes a plurality of lens elements 22, 24, 25, 26 and 28. The plurality of lens elements 22-28, the IR cut-off filter 40, the at least one glare reducing element 41, the cover glass 42, the imaging chip 44 and the camera board 46 are coaxial with an optical axis 150. It will be understood that while the optical axis 150 is "longitudinal" in the illustrated embodiment since a camera coordinate system is defined, the optical axis 150 can include any angle from an origin based on which coordinate system is being defined. For instance, the optical axis 150 can extend from a vehicle rear and include an angle of pitch slightly downward toward the ground when a world coordinate system is defined. Light 102 from a light source sequentially passes through each of the lens elements 22-28, the IR cut-off filter 40, the at least one glare reducing element 41 and the cover glass 42 before being received at the imaging chip 44. In one embodiment, the at least one glare-reducing element 41 is disposed between the IR cut-off filter 40 and the cover glass 42, wherein the at least one glare-reducing element is placed on top of the cover glass 42 with respect to the optical axis 150. In the illustrated embodiment, the cover glass 42 is placed on top of the imaging chip 44. While the term "glass" is used to describe the cover glass 42, it will be understood that polycarbonates or plastics can be utilized instead of glass. In another embodiment, the at least one glare-reducing element 41 is placed underneath the cover glass 42. It will be appreciated that the at least one glare-reducing element 41 is placed underneath the cover glass 42 when the cover glass 42 and the at least one glare-reducing element 41 are integrated during fabrication of the imaging chip 44, whereas the at least one glare-reducing element 41 is placed on top of the cover glass when the cover glass 42 and the at least one glare-reducing element 41 are assembled after fabrication of the imaging chip 41. In another embodiment, the at least one glare-reducing element 41 can replace the cover glass 42 and be positioned on top of the imaging chip 44.

In the embodiments described herein, the camera device 100 is configured to capture a field of view (FOV) rearward of a subject vehicle; however, it should also be understood that the camera device 100 can be extended to capturing a FOV forward of the subject vehicle and to the sides of the subject vehicle. In a non-limiting exemplary embodiment, the camera device 100 is configured to capture a 180° FOV with a downward pitch toward a ground plane a subject vehicle is traveling upon. The camera device 100 is capable of receiving light, or other radiation, and converting the light energy to electrical signals in a pixel format using, for example, one of charged coupled device (CCD) sensors or complimentary metal-oxide-semiconductor (CMOS) sensors. The camera device can be mounted within or on any suitable structure that is part of the vehicle, such as bumpers, spoilers, trunk lids, fascia, grill, side-view mirrors, door panels, etc., as would be well understood and appreciated by those skilled in the art. Image data from the camera device 100 can be processed by a non-transitory processing device 48 in signal communication with the camera board 46 to generate an image that can be displayed on any vehicle display units including a rearview mirror display device 50 within the subject vehicle. In one embodiment, the rearview mirror display device 50 is integrated within a human machine interface (HMI) of the vehicle. In another embodiment, the rearview mirror display device 50 is integrated within a rearview mirror mounted on the interior of the subject vehicle.

Control module, module, control, controller, control unit, processor and similar terms mean any one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs or routines, combinational logic circuit(s), input/output circuit(s) and devices, appropriate signal conditioning and buffer circuitry, and other components to provide the described functionality. Software, firmware, programs, instructions, routines, code, algorithms and similar terms mean any instruction sets including calibrations and look-up tables. The control module has a set of control routines executed to provide the desired functions. Routines are executed, such as by a central processing unit, and are operable to monitor inputs from sensing devices and other networked control modules, and execute control and diagnostic routines to control operation of actuators. Routines may be executed at regular intervals, for example each 3.125, 6.25, 12.5, 25 and 100 milliseconds during ongoing engine and vehicle operation. Alternatively, routines may be executed in response to occurrence of an event.

The imaging chip 44 can be a color-sensitive imaging chip having an integrated circuit of an array of pixel sensors each including a photodetector and an active amplifier, or the imaging chip 44 can be a monochrome sensor. In one embodiment, the imaging chip is a complementary metal-oxide-semiconductor (CMOS) sensor. In another embodiment, the imaging chip is a charge-coupled device (CCD) sensor and is mounted to a camera board of the camera device. Both CCD and CMOS sensors function by employing photosensitive circuitry that reacts to light and stores analog signals as digital data, i.e., the captured image. The IR cut-off filter 40 can be utilized to block infrared light in a range of wavelengths of wavelengths exceeding a predetermined wavelength. The predetermined wavelength blocking infrared light can include 650 nm in one embodiment. However, the predetermined wavelength is not limited to any one specific value and can include wavelengths of 680 nm or 700 nm in other embodiments envisioned.

A CCD sensor is a photosensitive analog device that records light as a small electrical charge in each of its pixels or cells. In essence a CCD is a collection of CCD cells. The CCD circuit may include multiple layers of capacitors (e.g., stages) for transporting the analog signal to an array of flip-flops for storing the data controlled by a clock signal. Therefore, when light is received by a CCD sensor, the CCD sensor acquires an electrical charge according to how much light has hit the particular CCD cell, wherein each CCD cell can transfer its charge to its neighboring cell and then to external circuitry. An analog-to-digital converter may be employed to read the charge as an integer on a range.

In a CMOS sensor, each pixel has neighboring transistors that locally perform the analog to digital conversion. In one embodiment, each pixel may be an Active Pixel Sensor (APS). Imaging logic is integrated on the CMOS sensor itself, replacing the need for additional circuitry required by CCD sensors to perform the analog-to-digital conversion. Thus, power consumption for operating the CMOS sensor can be reduced. While design of CMOS sensors may be more expensive than CCD sensors due to the integrated circuitry, CMOS sensors can be inexpensively manufactured on any standard silicon production line. One drawback of CMOS sensors is that they are noisier than CCD sensors due to the additional circuitry integrated on the sensor.

Figure 2:
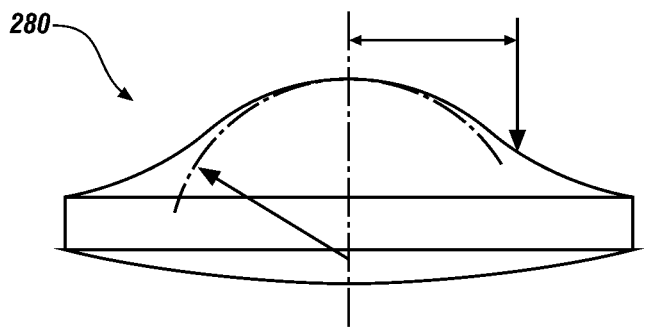
FIG. 2 illustrates an exemplary aspheric lens element, in accordance with the present disclosure.

In the illustrated embodiment of FIG. 1, the lens element 28 includes an aspheric lens element. Referring to FIG. 2, an exemplary non-limiting aspheric lens element 280 is schematically illustrated, in accordance with the present disclosure. The aspheric lens element 280 depicts surface profiles inherent to aspheric lenses. In the illustrated embodiment, the aspheric lens element 280 includes surface profiles that are not portions of a sphere or a cylinder. The exemplary aspheric lens element 280 can be designated with surface profiles as represented by Equation [1] as follows.

$$z(r) = \frac{r^2}{R(1 + \sqrt{1 - (1+k)\frac{r^2}{R^2}})} + \alpha_1 r^2 + \alpha_2 r^4 + \alpha_3 r^6 + \ldots, \quad [1]$$

wherein
Z is an optical axis having a direction,
Z(r) is a displacement of the surface from the vertex in the z-direction, at distance r from the axis,
r is a radius from the vertex,
R is a radius of curvature,
κ is a conic constant, and
$\alpha_i$ represents coefficients describing a deviation of the surface from an axially symmetric quadric surface specified by R and κ.

Equation [1] is provided as an exemplary non-limiting equation to achieve desired surface profiles of the aspheric lens element 280 of FIG. 2. This disclosure is not limited to utilizing Equation [1], wherein other equations for representing the surface profile of the aspheric lens element 28 of FIG. 1 can be utilized based on the design requirements to enhance the desired region within a captured image. As used herein, the term "desired region" refers to any one or more regions within a captured image where it is desirable to enhance resolution related to detail per pixel. For instance, the surface profile of the aspheric lens element 280 can be configured enlarge the desired region within a captured image resulting in enhanced resolution related to detail per pixel in this desired region. In contrast, images captured by a simple lens can result in a diminished and reduced center region, wherein software is subsequently utilized to stretch the captured image so that the center region can be enlarged once the captured image is displayed. This enlarged center region often has a diminished resolution related to detail per pixel due to a lower pixel density describing the same details. Embodiments herein are directed toward the aspheric lens element 280, e.g., aspheric lens element 28 of FIG. 1 including surface profiles selected to enhance a desired region of the displayed captured image. In some embodiments, surface profiles are selected to enlarge peripheral regions of the captured image.

Figure 3:
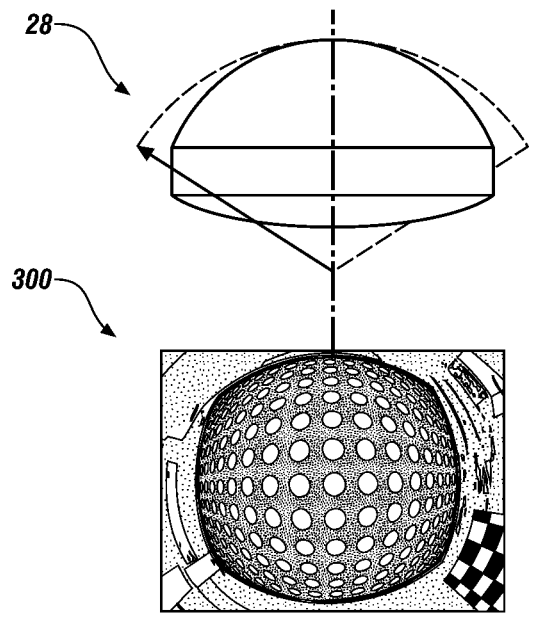
FIG. 3 illustrates the aspheric lens element used by the camera device of FIG. 1 and an image captured by the camera device using the aspheric lens element, in accordance with the present disclosure.

FIG. 3 illustrates the aspheric lens element 28 used by the camera device of FIG. 1 and an image 300 captured by the camera device 100 using the aspheric lens element 28, in accordance with the present disclosure. In the illustrated embodiment, the aspheric lens element 28 allows for the captured image 300 to include an enlarged center region. By configuring the lens 20 of FIG. 1 with the aspheric lens element 28 having desired surface profiles selected represented by an equation such as Equation [1], the captured image 300 includes an enlarged center region with resolution that is enhanced compared to that of an image having software applied thereto to enlarge the center region, as described above in the non-limiting embodiment of FIG. 2.

Figure 7:
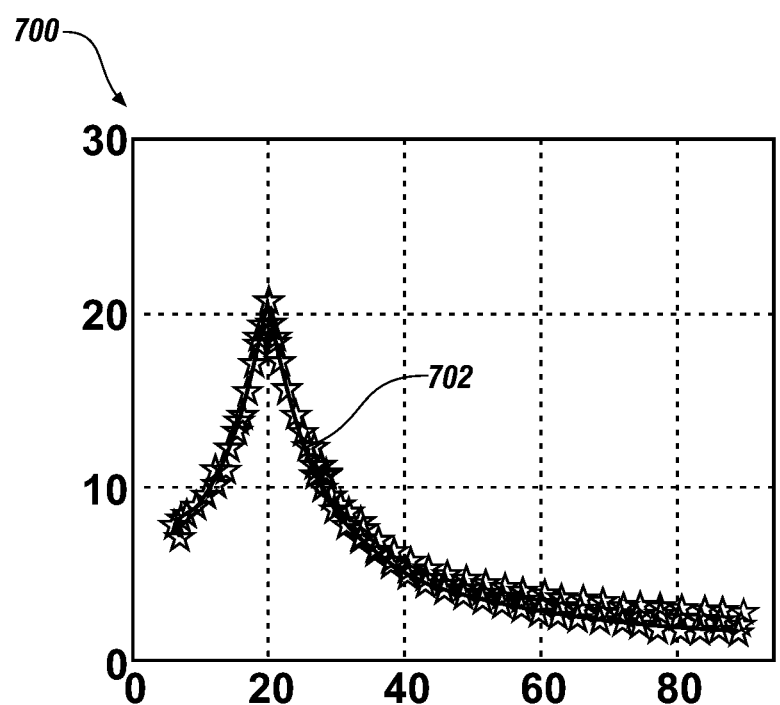
FIG. 7 illustrates an exemplary non-limiting plot depicting pixel density within a captured image with respect to an incident angle of the aspheric lens element of FIG. 1, in accordance with the present disclosure.

FIG. 7 illustrates an exemplary non-limiting plot 700 depicting pixel density within the captured image with respect to an incident angle of the lens 20. The horizontal x-axis denotes the incident angle (degrees) of incident light received at the lens 20 with respect to the optical axis 150. Pixel density profile 702 represents the pixel density with respect to the incident angle of the incident light received at the lens 20. In the illustrated non-limiting embodiment, the pixel density is at a peak when the incident angle is at 20 degrees. It will be appreciated that the surface profiles of the aspheric lens element can be selected to achieve the peak pixel density when the incident angle is at 20 degree for enhancing the desired region of the captured image.

Figures 1, 4:
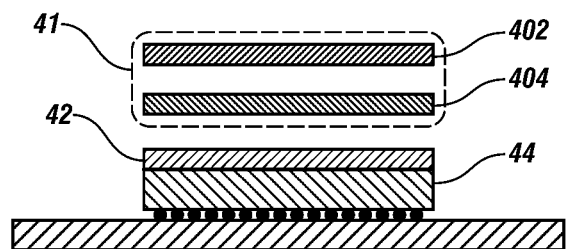
Figures 2, 4:
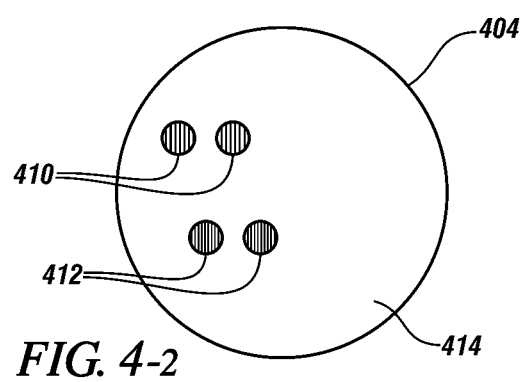

FIG. 4 illustrates the at least one glare-reducing element 41 of FIG. 1 including a polarized element 402 and a photochromic element 404, in accordance with the present disclosure. The at least one glare-reducing element 41 can be utilized to one of replace and cover the cover glass 42 of the camera device 100 of FIG. 1. In the illustrated embodiment, the polarized element 402 and the photochromic element 404 can be used alone, or in any combination, to reduce glare produced in images captured by the camera device 100 of FIG. 1. The polarized element 402 and the photochromic element 404 include materials selected from the group consisting of: glass, polycarbonates and plastics. In a non-limiting example, images captured during nighttime driving often include glare from headlights of other vehicles travelling on the roadway. Moreover, glare within images may be intensified when the camera device 100 faces a low-angled light source, such as the sun or other strong light sources. In another non-limiting example, wet road surfaces from weather and/or oil on the roadway can increase glare from reflection on the ground. The polarized element 402 is configured to reduce glare resulting from partially-polarized light in a horizontal plane, e.g., the ground, a water surface, or a wet road surface, by reflection.

The photochromic lens element 404 can be utilized to reduce glare in local areas or regions within the captured image. As used herein, the term "local areas" can refer to either one of direct light sources or reflected light that present glare in the captured image. In the illustrated embodiment, the photochromic element 404 includes transition glass configured to transition from a clear state to a darkened state when exposed to light. As used herein, the term "darkened state" refers to a magnitude of dimming applied to the photochromic lens element and the term "clear state" refers to no dimming applied to the photochromic element 404. Accordingly, higher magnitudes of dimming attenuate the transmitted light intensity, e.g., make light sources become less bright. Once the photochromic element is no longer exposed to the light, e.g., a light source is removed, the photochromic element 404 can return back to the clear state.

Further embodiments envisioned include application of an electrochromism layer. The electrochromism layer can be disposed underneath or over top of the cover glass 42 of FIG. 1. The electrochromism layer is configured to transition to a darkened state in response to a strong light input, e.g., saturation, detected upon photo sensors of the electrochromism layer. In one embodiment, selected portions or windows of the electrochromism layer are transitioned to the darkened state that are associated with photo sensors detecting saturation. Response times for the electrochromism layer transitioning to the darkened state are often less than response times for photochromic elements to transition to darkened states. In one embodiment, the application of the eletrochromism layer can replace the photochromic element 404.

In some embodiments, only corresponding portions of the photochromic element 404 that are exposed to light indicative of producing glare transition to the darkened state. All other portions of the photochromic element 404 not exposed to the light indicative of producing glare remain in the clear state. As used herein, the term "light indicative of producing glare" refers to a light intensity received at the corresponding portion of the photochromic element 404 that exceeds an intensity threshold. Moreover, the magnitude of dimming related to the darkened state can be directly proportional to the light intensity received at the corresponding portion of the photochromic element 404. As used herein, the term "light intensity" refers to a rate at which light spreads over a corresponding portion of the photochromic element 404 of a given area some distance from a light source. The light intensity is indirectly proportional with distance from the light source to the photochromic element 404. For instance, the light intensity exposed upon a corresponding portion of the photochromic element 404 from a light source decreases as the distance between the photochromic element 404 and the source increases. In one embodiment, the magnitude of dimming at a corresponding portion of the photochromic element 404 decreases as the distance between the photochromic element 404 and the source increases. In another embodiment, the magnitude of dimming at the corresponding portion of the photochromic element 404 increases as the distance between the photochromic element 404 and the source decreases.

Further, the light intensity is directly proportional to power of the respective light source transmitting the light. For instance, the light intensity exposed upon a corresponding portion of the photochromic element 404 from a light source increases as the power of the source increases. In one embodiment, the magnitude of dimming at a corresponding portion of the photochromic element 404 increases as the power of a respective light source increases. In another embodiment, the magnitude of dimming at the corresponding portion of the photochromic element 404 decreases as the power of the respective source decreases. It will be understood that the power of the respective light source is a more dominate factor affecting the intensity of the light source than the distance from the light source to the photochromic element 404.

FIG. 4-2 illustrates a non-limiting embodiment of a top view of the photochromic element 402 of FIG. 4-1 having portions of the photochromic element in the darkened state with different magnitudes of dimming applied thereto, in accordance with the present disclosure. As aforementioned, when light intensity exposed upon the photochromic element 404 from a source exceeds an intensity threshold, corresponding portions of the photochromic element 404 exposed to the received light can transition from the clear state to the darkened state. Further, the magnitude of dimming applied at the corresponding portions in the darkened state is directly proportional to the light intensity exposed thereon. In the illustrated embodiment, portions 410 and 412 include respective portions of the photochromic element 402 transitioned to the darkened state through exposure to light intensity from a source. In a non-limiting example, portions 410 correspond to light received from a first travelling vehicle and portions 412 correspond to light received from headlights of a second travelling vehicle, wherein each of the first and second travelling vehicles are following at respective distances behind a subject vehicle that includes the camera device 100 of FIG. 1 utilizing the photochromic element 404. The magnitude of dimming applied to each of the portions 410 and 412 is indicated by the magnitude of vertical lines within the respective portions 410 and 412, wherein more vertical lines are indicative of higher magnitudes of dimming. In the illustrated embodiment, the distance between the second travelling vehicle and the photochromic element 402 is closer than the distance between the first travelling vehicle and the photochromic element. Accordingly, the magnitude of dimming applied at portions 412 corresponding to the light received from the headlights of the second travelling vehicle is higher than the magnitude of dimming applied at portions 410 corresponding to the light received from the headlights of the first travelling vehicle. Remaining portion 414 is operative in the clear state, wherein no magnitude of dimming is applied thereto because the remaining portion 414 is not exposed to a light intensity exceeding the intensity threshold.

It will be understood that while the distance from the light source is a factor in determining the magnitude of dimming applied at portions of the photochromic element, the magnitude of dimming is dominated by the power of the respective light source. For instance, a strong power light source such as the sun that is a large distance from the photochromic element 404 would result in a higher a magnitude of dimming applied thereto than a weak power light source such as candle light at a very close distance to the photochromic element 404. Accordingly, the magnitude of dimming applied to the corresponding portions 410 and 412 can vary depending upon the power of the respective light sources. For instance, and in a non-limiting example, if the first traveling vehicle were to suddenly switch operation of the headlights from a low-beam state to a high-beam state, the magnitude of intensity received at the corresponding portions 410 would increase requiring the magnitude of dimming applied at the corresponding portion 410 to be increased in accordance therewith.

The exemplary photochromic element 404 of FIGS. 4-1 and 4-2 includes corresponding portions exposed to light indicative of producing glare to transition to the darkened state, wherein only corresponding pixels of the imaging chip 44 are permitted to receive the light dimmed by the photochromic element. The remaining pixels receive un-dimmed light that passes through the remaining portion 414 of the photochromic element 404 in the clear state. Accordingly, high magnitudes of light intensity can be dimmed at only pixels of the imaging chip respective to the corresponding portions of the photochromic element 404 exposed to the light intensity. Thus, the remaining pixels respective to the portions of the photochromic element 404 not exposed to light indicative of producing glare preserve normal image brightness and details without having any dimming effect applied thereto.

Referring back to FIG. 4-1, one embodiment may include only the polarized element 402 replacing the cover glass 42. In another embodiment, only the polarized element 402 is positioned on top of and covering the cover glass 42, or positioned underneath the cover glass 42. In yet another embodiment, only the photochromic element 404 replaces the cover glass 42. In yet another embodiment, only the photochromic element 404 is positioned on top of and covering the cover glass 42, or positioned underneath the cover glass 42. In even yet another embodiment, both the polarized element 402 and the photochromic element 50 replace the cover glass 42. In even yet another embodiment, both the pluralized element 402 and the photochromic element 404 are positioned on top of and covering the cover glass 42, or positioned underneath the cover glass 42.

Figure 5:
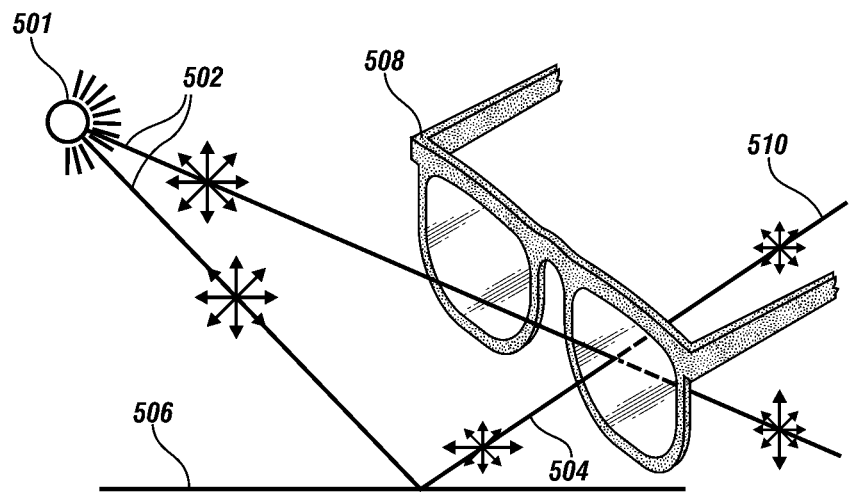
FIG. 5 illustrates a non-limiting example of direct light from a light source and light partially polarized in a horizontal plane by reflection, in accordance with the present disclosure.

FIG. 5 illustrates a non-limiting example of un-polarized direct light 502 from a light source (e.g., sun) 501 and partially-polarized light 504 in a horizontal plane by reflection off of ground 506. Ground 506 can be indicative of a wet or icy surface. In the non-limiting example, sunglasses 508 incorporating a polarized lens element can significantly reduce glare resulting from the partially-polarized light 504 in the horizontal plane by reflection. For instance, the polarized lens element can be configured to transmit only vertically-polarized light 510 to reduce the partially-polarized light 504 in the horizontal plane. Moreover, the sunglasses 508 may be transition glasses that incorporate a photochromic lens element to significantly reduce glare and strong light resulting from the light 502 from the light source 501. For instance, the photochromic lens element can be configured to transition from a clear state to a darkened state when exposed to the light 502. These same principles can be applied to the camera device 100 of FIG. 1 to reduce glare form headlights of other roadway vehicles in the horizontal plane by reflection from the roadway surface.

Motion blur within captured images can result by long exposure times of the camera device. Exposure times are indicative of the accumulation of light received by the camera device 100. One approach to reduce image motion blurring is to reduce image exposure time and improve image sensitivity. IR cut-off filters block IR light. If an IR cut-off (e.g., IR cut-off filter 40 of FIG. 1) filter is not employed, image sensitivity is increased but color fidelity is reduced. If an IR cut-off filter is employed, image sensitivity is reduced but color fidelity is maintained. It will be understood that increased image sensitivity from the transmission of IR light is desired for capturing images during nighttime or otherwise dark ambient conditions. Accordingly, it is desirable to increase color fidelity for day light driving conditions and to increase or enhance image sensitivity for night time driving conditions.

Figure 6:
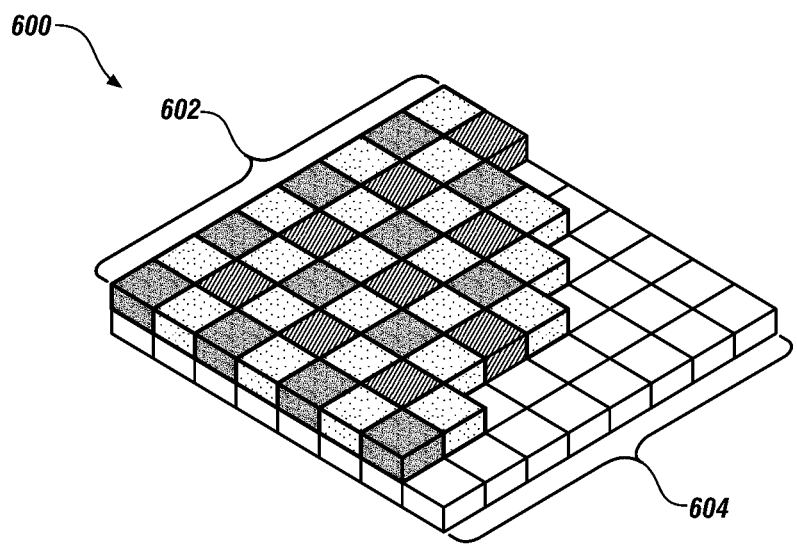
FIG. 6 illustrates a non-limiting example of a color-sensitive imaging chip, in accordance with the present disclosure.

FIG. 6 illustrates a non-limiting example of a color-sensitive imaging chip 600, in accordance with the present disclosure. The color-sensitive imaging chip 600 includes a plurality of color pixels 602 and an imaging chip 604. Each of the pixels 602 are adjustable between one of a short-exposure time and a long-exposure time at a time. In some embodiments, long-exposure times are desirable during low-light or night time ambient conditions to increase the magnitude of light received. The imaging chip 604 can be a CMOS sensor or a CCD sensor. CMOS and CCD sensors are sensitive to wavelengths in the near IR range extending to about 1,000 nm, resulting in unnatural images due to enhanced image sensitivity but poor color information. The plurality of color pixels 602 include green (Gr and Gb), blue (B) and red (R) pixels each having a respective response to light (wavelength). The configuration of the plurality of color pixels enables an increased color sensitivity; however, long exposure times additionally capturing IR light can result in poor color sensitivity that distorts image color fidelity. Accordingly, an IR cut-off filter (e.g., IR cut-off filter 40) can be employed to effectively block IR light beyond a predetermined wavelength, such that color fidelity is increased. However, blocking IR light reduces image sensitivity that may be desirable during nighttime driving conditions and enhances image motion blur. In one embodiment, the imaging chip 41 of the camera device 100 includes the color-sensitive imaging chip 600 of FIG. 6.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. Apparatus for capturing an image, comprising:
   a plurality of lens elements coaxially encompassed within a lens housing, one of the lens elements including an aspheric lens element having a biconvex surface profile configured to enhance a center region of a captured image, said biconvex surface profile including a first convex aspheric surface and a second convex aspheric surface;
   at least one glare-reducing element coaxial with the plurality of lens elements and receiving light subsequent to the light sequentially passing through each of the lens elements;
   a color sensitive imaging chip receiving the light subsequent to the light passing through the at least one glare-reducing element, the color sensitive imaging chip including a plurality of color pixels and an imaging chip, each of the plurality of color pixels adjustable between one of a short-exposure time and a long-exposure time; and
   an infrared cut-off filter lens element coaxially disposed between the aspheric lens element and the at least one glare-reducing element, the infrared cut-off filter configured to block infrared light within a predetermined range of wavelengths such that color fidelity is maintained in the color sensitive imaging chip.

2. The apparatus of claim 1, wherein the surface profile of said aspheric lens element enlarges the center region of the captured image without using imaging processing to stretch the captured image.

3. The apparatus of claim 1, wherein the surface profile of said aspheric lens element is configured in accordance with following relationship:

$$z(r) = \frac{r^2}{R(1 + \sqrt{1-(1+k)\frac{r^2}{R^2}})} + \alpha_1 r^2 + \alpha_1 r^4 + \alpha_3 r^6 + ...,$$

wherein
Z is an optical axis having a direction,
Z(r) is a displacement of the surface from the vertex in the z-direction, at distance r from the axis,
r is a radius from the vertex,
R is a radius of curvature,
κ is a conic constant, and
$\alpha_i$ represents coefficients describing a deviation of the surface from an axially symmetric quadric surface specified by R and κ.

4. The apparatus of claim 1, wherein the at least one glare-reducing element comprises at least one of a polarized element and a photochromic element.

5. The apparatus of claim 4, wherein the polarized element is configured to reduce glare resulting from partially-polarized light in a horizontal plane by reflection.

6. The apparatus of claim 5, wherein the polarized element is configured to transmit only vertically-polarized light to reduce the partially-polarized light in the horizontal plane by reflection.

7. The apparatus of claim 4, wherein the photochromic element is configured to transition from a clear state to a darkened state when exposed to a light intensity exceeding an intensity threshold and transition back to the clear state when the photochromic element is no longer exposed to the light intensity exceeding the intensity threshold.

8. The apparatus of claim 7, wherein the light intensity is directly proportional to power of a source transmitting the light and indirectly proportional to a distance between the source and the photochromic element.

9. The apparatus of claim 7, wherein only corresponding portions of the photochromic element that are exposed to light intensity exceeding the intensity threshold transition to the darkened state while all other portions not exposed to light intensities exceeding the intensity threshold remain in the clear state.

10. The apparatus of claim 9, wherein the darkened state includes a varying magnitude of dimming applied to the corresponding portions of the photochromic element directly proportional to light intensity exposed upon the corresponding portions.

11. The apparatus of claim 1, further comprising:
    an electrochromism layer configured to transition to a darkened state in response to photo sensors disposed on the electrochromism layer detecting saturation.

12. The apparatus of claim 1, wherein said at least one glare-reducing element covers the imaging chip with no other elements disposed between said at least one glare-reducing element and the imaging chip.

13. The apparatus of claim 1, further comprising:
    a cover glass coaxially disposed at a location comprising one of:
       between the at least one glare-reducing element and the imaging chip; and
       on top of the at least one glare-reducing element.

14. Apparatus for capturing glare-reduced images, comprising:
    an aspheric lens element having a biconvex surface profile selected to enhance a center region within captured images, said biconvex surface profile including a first convex aspheric surface and a second convex aspheric surface;
    coaxial with the aspheric lens element, at least one glare-reducing element comprising:
       a polarized lens element configured to transmit only vertically-polarized light to reduce partially-polarized light in a horizontal plane by reflection off a ground surface, said partially-polarized light in the horizontal plane passing through the aspheric lens element before being received at the polarized lens element; and a photochromic element configured to transition from a clear state to a darkened state when exposed to light subsequent to the light passing through the aspheric lens element;

a color sensitive imaging chip receiving the light subsequent to the light passing through the at least one glare-reducing element, the color sensitive imaging chip including a plurality of color pixels and an imaging chip, each of the plurality of color pixels adjustable between one of a short-exposure time and a long-exposure time; and an infrared cut-off filter lens element coaxially disposed between the aspheric lens element and the at least one glare-reducing element, the infrared cut-off filter configured to block infrared light within a predetermined range of wavelengths such that color fidelity is maintained in the color sensitive imaging chip.

15. The apparatus of claim 14, wherein the surface profile of said aspheric lens element is configured in accordance with following relationship:

$$z(r) = \frac{r^2}{R(1+\sqrt{1-(1+k)\frac{r^2}{R^2}})} + \alpha_1 r^2 + \alpha_2 r^4 + \alpha_3 r^6 + \ldots,$$

wherein
- Z is an optical axis having a direction,
- Z(r) is a displacement of the surface from the vertex in the z-direction, at distance r from the axis,
- r is a radius from the vertex,
- R is a radius of curvature,
- κ is a conic constant, and
- $\alpha_i$ represents coefficients describing a deviation of the surface from an axially symmetric quadric surface specified by R and κ.

16. The apparatus of claim 14, wherein the polarized element only transmits vertically-polarized light to reduce the partially-polarized light in the horizontal plane by reflection off the ground surface.

17. The apparatus of claim 14, wherein only corresponding portions of the photochromic element that are exposed to a light intensity exceeding an intensity threshold transition to the darkened state while all other portions not exposed to light intensities exceeding the intensity threshold remain in the clear state.

18. The apparatus of claim 14, wherein the at least one glare-reducing element covers the imaging chip with no other elements disposed between the at least one glare-reducing element and imaging chip.

19. The apparatus of claim 14, further comprising:
a cover glass coaxially disposed at a location comprising one of:
between the at least one glare-reducing element and the imaging chip; and
on top of the at least one glare-reducing element.

* * * * *